United States Patent
Berthold et al.

(10) Patent No.: US 7,436,694 B2
(45) Date of Patent: Oct. 14, 2008

(54) NONVOLATILE MEMORY CELL

(75) Inventors: Joerg Berthold, Munich (DE); Dieter Draxelmayr, Osterreich (AT); Winfried Kamp, Munich (DE); Michael Kund, Tuntenhausen (DE); Tim Schoenauer, Munich (DE)

(73) Assignee: Infineon Technologies AG (DE)

( * ) Notice: Subject to any disclaimer, the term of this patent is extended or adjusted under 35 U.S.C. 154(b) by 287 days.

(21) Appl. No.: 11/444,295

(22) Filed: May 31, 2006

(65) Prior Publication Data

US 2007/0047292 A1 Mar. 1, 2007

(30) Foreign Application Priority Data

May 31, 2005 (DE) .................. 10 2005 024 897

(51) Int. Cl.
*G11C 11/00* (2006.01)

(52) U.S. Cl. .................. 365/148; 365/100; 365/154

(58) Field of Classification Search .......... 365/148, 365/154, 100

See application file for complete search history.

(56) References Cited

U.S. PATENT DOCUMENTS

| 5,020,029 | A | * | 5/1991 | Ichinose et al. | ............ 365/154 |
| 5,057,893 | A | * | 10/1991 | Sheng et al. | ................ 257/296 |
| 5,132,929 | A | * | 7/1992 | Ochii | ........................ 365/201 |
| 5,377,140 | A | * | 12/1994 | Usuki | ........................ 365/154 |
| 5,761,113 | A | * | 6/1998 | Natsume et al. | ............ 365/154 |
| 5,852,573 | A | * | 12/1998 | Yang et al. | .................. 365/154 |
| 6,038,163 | A | * | 3/2000 | Clemens et al. | ............ 365/154 |
| 6,853,579 | B1 | * | 2/2005 | Chou | ........................ 365/154 |
| 6,934,181 | B2 | * | 8/2005 | Chu et al. | .................... 365/154 |
| 7,262,639 | B2 | * | 8/2007 | Mulder et al. | ................ 327/65 |
| 2004/0125643 | A1 | | 7/2004 | Kang et al. | |
| 2004/0125644 | A1 | | 7/2004 | Komatsuzaki | |
| 2004/0141363 | A1 | | 7/2004 | Ohtsuka et al. | |

* cited by examiner

*Primary Examiner*—Richard T. Elms
*Assistant Examiner*—Eric Wendler
(74) *Attorney, Agent, or Firm*—Dickstein, Shapiro, LLP.

(57) ABSTRACT

Nonvolatile memory cell, having a first resistor that is electrically programmable in a nonvolatile fashion, a second resistor that is electrically programmable in a nonvolatile fashion, a first leakage current reducing element connected between the first resistor and an operating potential, and a second leakage current reducing element connected between the second resistor and the operating potential.

36 Claims, 7 Drawing Sheets

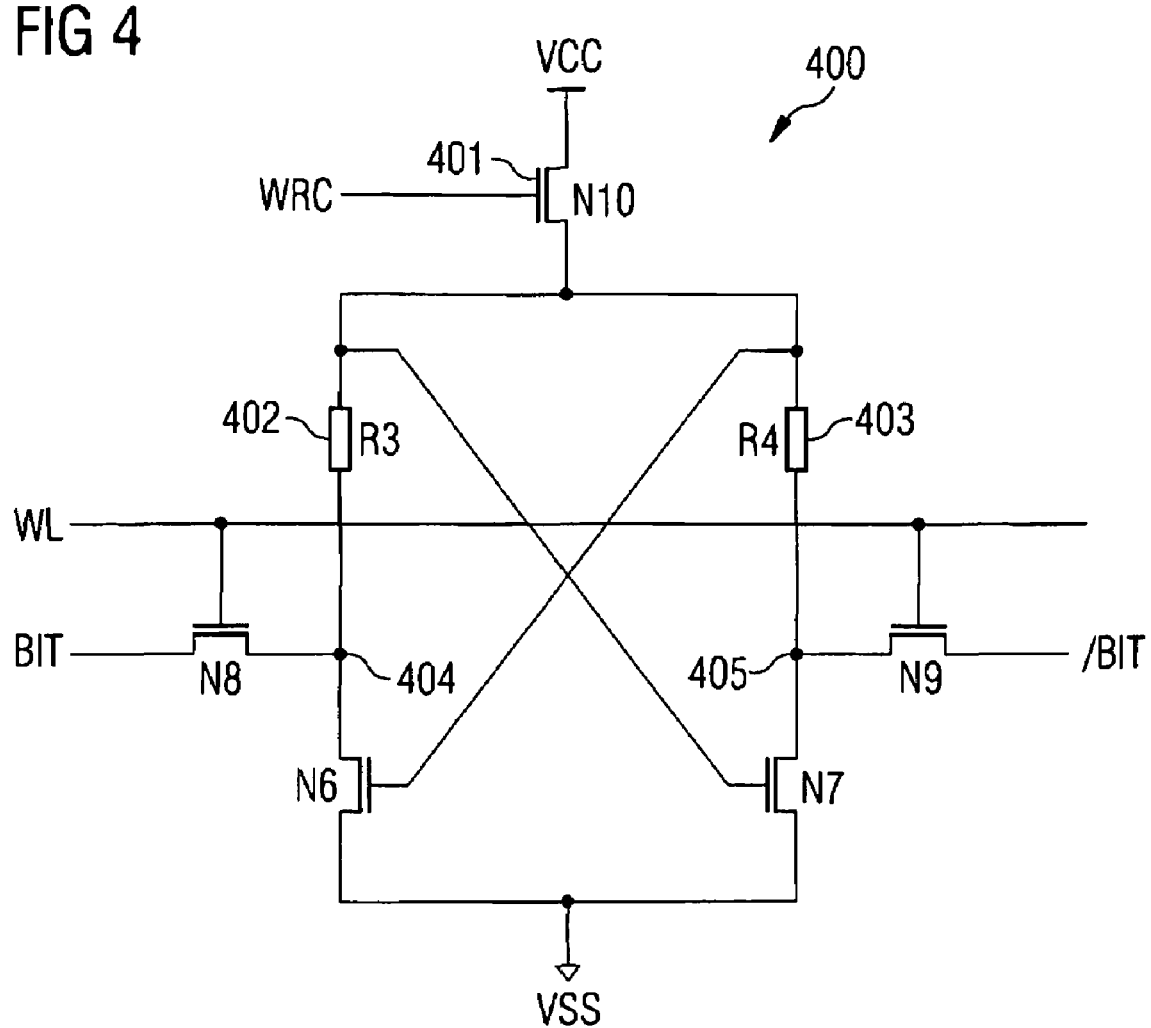

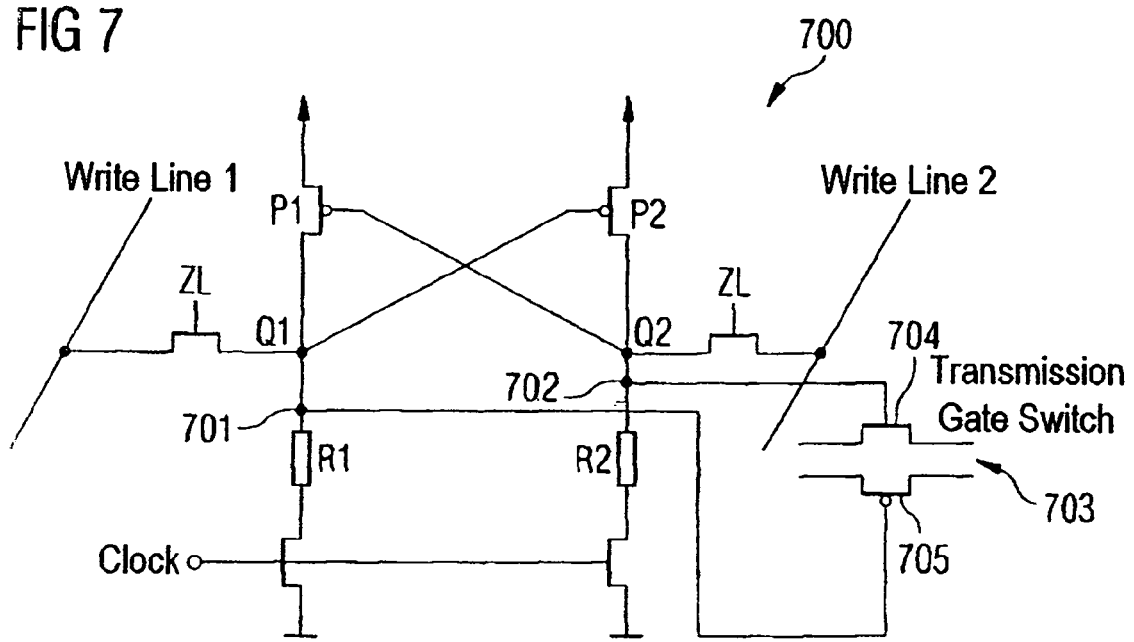
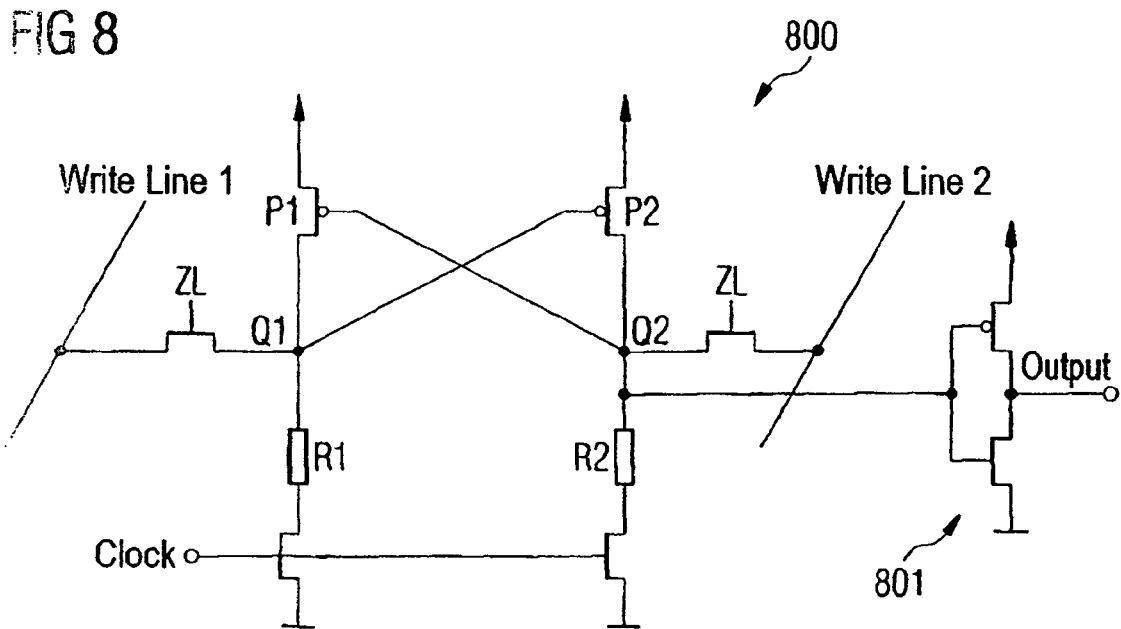

_US 7,436,694 B2_

NONVOLATILE MEMORY CELL

CROSS-REFERENCE TO RELATED APPLICATION

This application claims priority to German Patent Application Serial No. 102050024897.7, which was filed on May 31, 2005, and incorporated herein by reference in its entirety.

FIELD OF THE INVENTION

The invention relates to a nonvolatile memory cell.

BACKGROUND OF THE INVENTION

Memory cells are necessary in any application that requires the storage of data. Typical semiconductor circuits have memory cells either distributed between logic switching elements or in the form of block memories, such as SRAM memories for example. A block memory comprises a matrix of memory cells, only a small number of cells being affected by read or write operations. Therefore, the rows of the memory matrix can share elements that support the write or read operations such as sense amplifiers for example.

On the other hand, in the case of distributed memory cells for example as part of a logic circuit, it is typically necessary for the cells to constantly keep their stored information ready: the cells are continually read out.

Particularly in mobile applications, it is also important to keep the energy consumption of the memory cells as low as possible.

SUMMARY OF THE INVENTION

In accordance with one exemplary embodiment of the invention, a nonvolatile memory cell is provided, having a first resistor that is electrically programmable in nonvolatile fashion, a second resistor that is electrically programmable in nonvolatile fashion, a first leakage current reducing element connected between the first resistor and an operating potential, and a second leakage current reducing element connected between the second resistor and the operating potential.

In accordance with one exemplary embodiment of the invention, a programmable nonvolatile memory cell having a low power loss is provided.

BRIEF DESCRIPTION OF THE DRAWINGS

Exemplary embodiments of the invention are illustrated in the figures and are explained in more detail below. In the figures:

FIG. 4 shows a nonvolatile memory cell with a flip-flop circuit and a transistor for reducing the leakage currents;

FIG. 7 shows a nonvolatile memory cell that controls a switch, in accordance with a further exemplary embodiment of the invention; and FIG. 8 shows a nonvolatile memory cell with an output buffer in accordance with an alternative exemplary embodiment of the invention.

DETAILED DESCRIPTION OF PREFERRED EMBODIMENTS OF THE INVENTION

Figure 1:
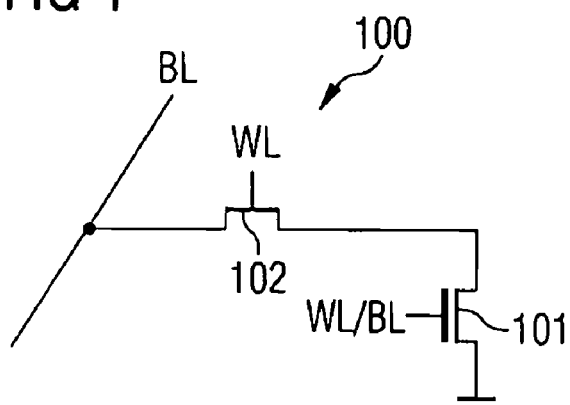
FIG. 1 shows a flash memory cell.

In accordance with one exemplary embodiment of the invention, a low-loss nonvolatile memory cell is provided, having a first transistor and a second transistor. A first source/drain terminal of the first transistor is coupled to a first node, and a first source/drain terminal of the second transistor is coupled to a second node. The first transistor and the second transistor are cross-coupled to one another, the gate terminal of the first transistor being coupled to the second node and the gate terminal of the second transistor being coupled to the first node. The nonvolatile memory cell has a third transistors, the first source/drain terminal of which is coupled to the first node, the second source/drain terminal of which is coupled to a first write line and the gate terminal of which is coupled to an access line. Furthermore, the nonvolatile memory cell has a fourth transistor, the first source/drain terminal of which is coupled to the second node, the second source/drain terminal of which is coupled to a second write line and the gate terminal of which is coupled to the access line. Moreover, the memory cell has: a first resistor that can be electrically programmed in nonvolatile fashion, the first terminal of said resistor being coupled to the first node, and a second resistor that can be electrically programmed in nonvolatile fashion, the first terminal of said resistor being coupled to the second node. The nonvolatile memory cell has: a fifth transistor for reducing the leakage current flowing through the first resistor, the first source/drain terminal of said transistor being coupled to the second terminal of the first resistor or to the second terminal of the first transistor, and a sixth transistor for reducing the leakage current flowing through the second resistor, the first source/drain terminal of said transistor being coupled to the second terminal of the second resistor or to the second terminal of the second transistor.

The nonvolatile memory cell in accordance with one exemplary embodiment has the advantage that, on account of the two transistors for reducing the leakage currents that are respectively connected in series with the resistors that can be programmed in nonvolatile fashion, the leakage currents between the two resistors that can be programmed in nonvolatile fashion are also reduced, so that the energy consumption for maintaining the potential difference between the two nodes and thus for preserving the logic state at the outputs of the memory cell is reduced.

The two transistors for reducing the leakage currents are pulsed in such a way that writing operations are possible and that the potential difference between the two nodes, which represents the corresponding logic value, remains sufficiently high.

In accordance with another exemplary embodiment of the invention, it is provided that the nonvolatile memory cell has a first transistor and a second transistor. A first source/drain terminal of the first transistor is coupled to a first node and a first source/drain terminal of the second transistor is coupled to a second node. The first transistor and the second transistor are cross-coupled to one another, the gate terminal of the first transistor being coupled to the second node and the gate terminal of the second transistor being coupled to the first node. The nonvolatile memory cell has a third transistor, the first source/drain terminal of which is coupled to the first node, the second source/drain terminal of which is coupled to a first write line and the gate terminal of which is coupled to an access line. Furthermore, the nonvolatile memory cell has a fourth transistor, the first source/drain terminal of which is coupled to the second node, the second source/drain terminal of which is coupled to a second write line and the gate terminal of which is coupled to the access line. The nonvolatile memory cell has: a first resistor that can be electrically programmed in nonvolatile fashion, the first terminal of said resistor being coupled to the first node, a second resistor that can be electrically programmed in nonvolatile fashion, the first terminal of said resistor being coupled to the second node, and a fifth transistor for reducing the leakage current, the first source/drain terminal of said transistor being coupled to the second source/drain terminal of the first transistor and the second source/drain terminal of the second transistor.

In accordance with another configuration of the invention, the transistors of the nonvolatile memory cell are field effect transistors.

The latter are particularly well suited to memory elements because the control of the transistors functions virtually with no current, in contrast to bipolar transistors.

In accordance with another configuration of the invention, the transistors of the nonvolatile memory cell are n-field effect transistors.

The use of n-field effect transistors is expedient particularly when the programming of the resistors that can be programmed in nonvolatile fashion is carried out by means of an electric current. The use of only a single type of transistor brings about a greater integration density of the arrangement.

In an alternative embodiment of the invention, the first transistor, the second transistor, the third transistor and the fourth transistor are n-field effect transistors and the fifth transistor and the sixth transistor are p-field effect transistors.

In accordance with an alternative embodiment, all the transistors of the nonvolatile memory cell are n-field effect transistors, the fifth transistor being an n-field effect transistor connected between the reference potential and the first transistor and the second transistor.

The type of the arrangement means that the full voltage swing is ensured for the reading/writing operation and on the n-field effect transistors are used, which results in a higher integration density.

According to another exemplary embodiment, the first transistor, the second transistor, the third transistor and the fourth transistor of the nonvolatile memory cell are n-field effect transistors, and the fifth transistor for reducing the leakage current is a p-field effect transistor connected between the operating voltage and the first transistor and the second transistor.

In accordance with an alternative exemplary embodiment of the invention, the second source/drain terminal of the fifth transistor and the second source/drain terminal of the sixth transistor are in each case coupled to the operating voltage.

In accordance with yet another exemplary embodiment of the invention, the second source/drain terminal of the first transistor and the second source/drain terminal of the second transistor are in each case coupled to a reference potential.

In accordance with yet another embodiment of the invention, the reference potential is the ground potential.

In accordance with an alternative embodiment of the invention, the first transistor and the second transistor are p-field effect transistors, and the third transistor, the fourth transistor, the fifth transistor and the sixth transistor are n-field effect transistors.

In another embodiment of the invention, the first transistor, the second transistor, the third transistor and the fourth transistor are p-field effect transistors and the fifth transistor and the sixth transistor are n-field effect transistors.

This alternative is advantageous if a high operating voltage $V_{dd}$ is required at the two nodes in order to program the resistance elements.

In yet another embodiment of the invention, the second source/drain terminal of the firth transistor and of the sixth transistor are in each case coupled to a reference potential.

In the case where operation of the resistors that can be programmed in nonvolatile fashion requires a specific voltage range, the resistors that can be programmed in nonvolatile fashion may be connected to intermediate voltage nodes.

In another exemplary embodiment of the invention, the reference potential is the ground potential.

In yet another exemplary embodiment of the invention, the second source/drain terminal of the first transistor and of the second transistor is in each case coupled to the operating voltage.

In another exemplary embodiment, the two resistors that can be programmed in nonvolatile fashion are PCRAM resistors (PCRAM=phase change RAM).

In yet another exemplary embodiment, the two resistors that can be programmed in nonvolatile fashion are MRAM resistors (MRAM=magnetoresistive RAM).

In another exemplary embodiment, the two resistors that can be programmed in non-volatile fashion are CBRAM resistors (CBRAM=conductive bridging RAM).

In another exemplary embodiment of the invention, the first node is coupled to the gate terminal of a first transistor of a transmission gate switch and the second node is coupled to the gate terminal of a second transistor of the transmission gate switch.

The advantage of the invention is that a continuous voltage is provided by the continuous storage of the charges in the two nodes, to which voltage a load can be applied. In this case, it is possible for the memory cell to be read continuously without a sense amplifier, which is necessary for example in the case of programmable circuits (e.g. FPGAs). A circuit may for example configure connections using a transmission gate switch, the mutually complementary signals at the outputs of the nonvolatile memory cell being used here for controlling the transmission gate switch.

In an alternative exemplary embodiment of the invention, at least one output buffer is coupled in each case to one of the outputs.

The resistors that can be electrically programmed in nonvolatile fashion and exhibit different conductivity bring about a different rise in the potential at the first node and the second node.

In another embodiment of the invention, a semiconductor component has at least one of the low-power-loss nonvolatile memory cells.

One aspect of the invention comprises storing a bit by modifying the resistance values of the two resistance elements that can be programmed in nonvolatile fashion and are integrated into a circuit, so that the data can be read even after the operating voltage has been switched off and the writing operation is facilitated. The invention uses resistance elements whose resistance value can be changed in such a way that the resistance value remains unaltered even if no operating voltage is applied. Energy losses are reduced by the use of the fifth transistor and the sixth transistor for reducing the leakage currents through the two resistors that can be programmed in nonvolatile fashion.

By way of example, a Flash memory cell 100 as shown in FIG. 1 is conventionally used as a nonvolatile memory, said Flash memory cell comprising a memory transistor 101, in which a so-called floating gate comprising an insulating semiconductor layer contains the stored information of the Flash memory cell 100 as charge, and a pass transistor 102, which controls the charge flow to and from the memory transistor 100. In addition, the Flash memory cell 100 requires a high second supply voltage (12 V to 18 V), which results in a larger area taken up for the charge pumps that generate the required second supply voltage from the supply voltage of the chip, and, moreover, problems such as crosstalk occur. Flash technology also has a limited scaling potential. Furthermore, a memory cell in a Flash memory can be rewritten to only approximately 100,000 times.

Figure 2:
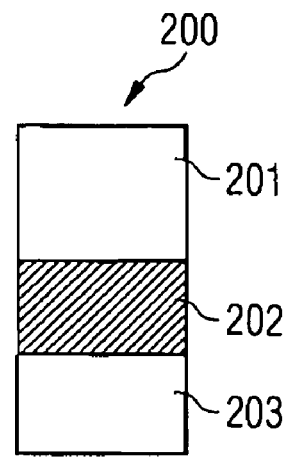
FIG. 2 shows a nonvolatile phase change memory cell.

Furthermore, a nonvolatile phase change memory cell 200 shown in FIG. 2 has: a top electrode 201, a phase change resistance layer 202 and a bottom electrode 203. If a programming current flows through the resistor 202, a high temperature is generated, which induces a phase change of the memory material, as a result of which the conductivity of the phase change resistance layer is changed. Consequently, the phase change memory cell 200 can store nonvolatile data corresponding to two different resistance values.

Figure 3:
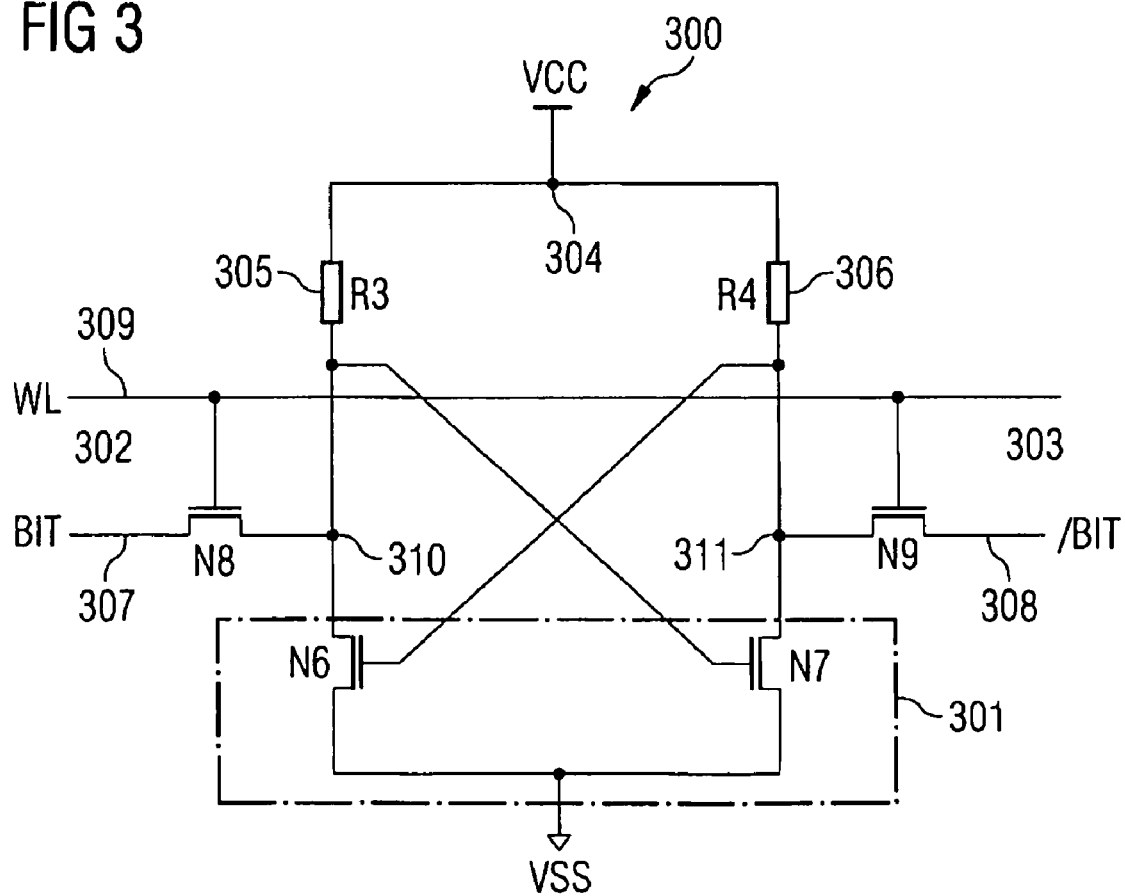
FIG. 3 shows a nonvolatile memory cell with a flip-flop circuit.

Furthermore, a nonvolatile memory cell 300 shown in FIG. 3 has: a flip-flop unit 301, access controllers 302, 303 and an operating voltage source VCC 304. The flip-flop unit has an n-MOS gate and stores complementary data in the nodes 310, 311. The nonvolatile resistance memories 305, 306 connected between the flip-flop circuit 301 and the operating voltage VCC 304 store different logic values depending on the state of the resistance, which is changed by the current intensity of the programming current. The access controllers 302, 303 control the connection between the bit lines 307, 308 and the flip-flop unit 301 depending on a switching state of a word line 309.

However, a leakage current flows through the resistors that can be programmed in nonvolatile fashion even if they have a high resistance, so that energy is consumed for maintaining the potential difference between the two nodes 310, 311 by the operating voltage source. Moreover, depending on the type and technology of the nonvolatile memory elements, a leakage current may, under certain circumstances, lead to undesirable erasure of the programmed resistance value.

In order to prevent this, as shown in FIG. 4 a switching transistor 401 for controlling the reading/writing operation and for reducing leakage currents is connected between the operating voltage and the two resistors 402, 403 that can be programmed in nonvolatile fashion.

One disadvantage of this arrangement, however, is that leakage currents can flow between the resistors 402, 403 themselves, which leads to a slow exchange of charge between the two nodes 404, 405 and thus to the above-described reduction of the potential difference between the two nodes 404, 405, so that this has to be compensated for by means of the operating voltage source, which in turn leads to an increased energy consumption. Moreover, the full voltage swing is not ensured via the transistor 401 since it is connected toward the operating voltage.

Figure 5A:
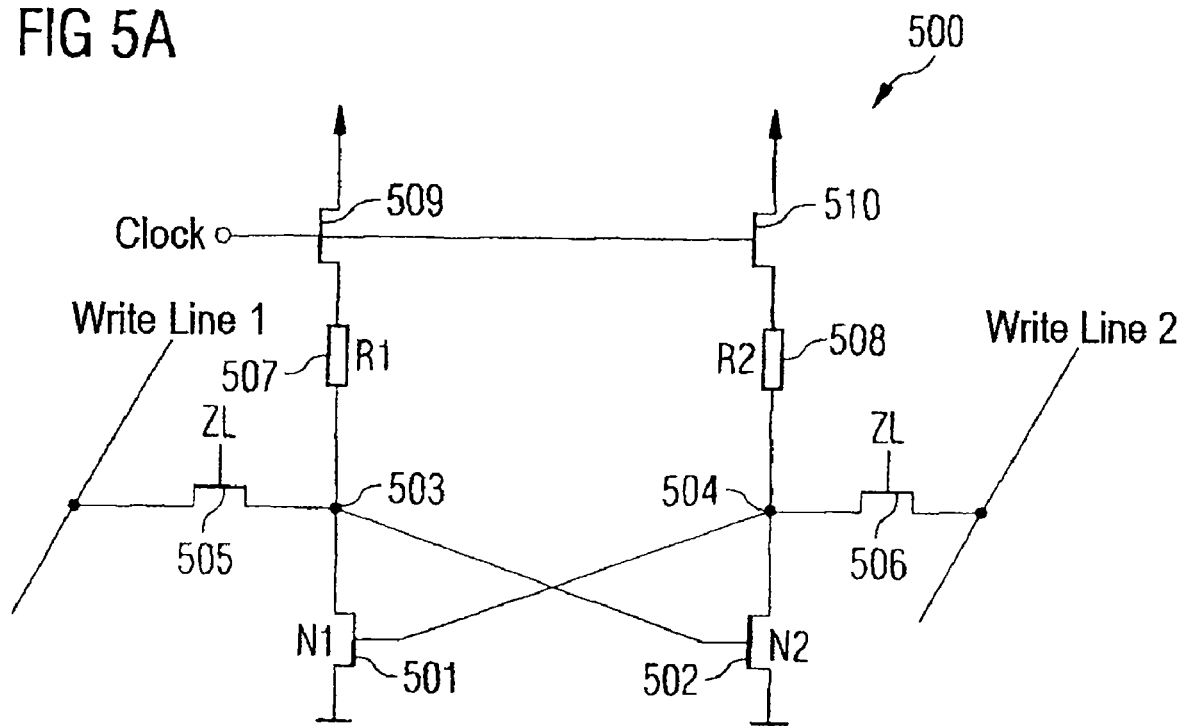
FIGS. 5*a* to 5*f* show nonvolatile memory cells in accordance with exemplary embodiments of the invention.

FIG. 5a shows a nonvolatile memory cell 500 having only n-field effect transistors, which are advantageous if the two resistors 507, 508 that can be programmed in nonvolatile fashion are programmed by a current, since the inherent forward current of an n-field effect transistor is greater than that of a p-field effect transistor. The first source/drain terminal of the first transistor 501 is coupled to the first node 503, and the first source/drain terminal of the second transistor 502 is coupled to the second node 504. The second source/drain terminal of the first transistor 501 is coupled to the ground potential and the second source/drain terminal of the second transistor 502 is likewise coupled to the ground potential. The first transistor 501 and the second transistor 502 are cross-coupled to one another, the gate terminal of the first transistor 501 being coupled to the second node 504 and the gate terminal of the second transistor 502 being coupled to the first node 503. The third transistor 505 is coupled to the first node 503 via the first source/drain terminal and is coupled to a first write line via the second source/drain terminal and is coupled to an access line ZL via the gate terminal. The fourth transistor 506 is coupled to the second node 504 via the first source/drain terminal and is coupled to a second write line via the second source/drain terminal and is coupled to the access line ZL via the gate terminal. The first resistor 507 that can be electrically programmed in nonvolatile fashion is coupled to the first node 503 via its first terminal and the second resistor 508 that can be electrically programmed in nonvolatile fashion is coupled to the second node 504 via its first terminal. The fifth transistor 509 for reducing the leakage current flowing through the first resistor 507 is coupled to the second terminal of the first resistor 507 via the first source/drain terminal and is coupled to the operating voltage via the second source/drain terminal, and the sixth transistor 510 for reducing the leakage current flowing through the second resistor 508 is coupled to the second terminal of the second resistor 508 via its first source/drain terminal and is coupled to the operating voltage via its second source/drain terminal.

The two resistors 507, 508 that can be programmed in nonvolatile fashion may be so-called PCRAM (or PRAM) resistors, MRAM resistors or CBRAM (or PMC, or IMT) resistors. PCRAM technology is based on the principle of a reversible thermally induced phase change between the amorphous and the (poly)crystalline phase of an e.g. Chalcogenide glass. An amorphous state is characterized by a high resistance value, while a polycrystalline state is characterized by a low resistance value. The duration and the intensity of the electric current pulse with which the resistor is programmed decide whether the resistance material undergoes transition to the amorphous phase and thus has a high resistance value, or whether it undergoes transition to the crystalline phase and thus has a low resistance value. The phase change between the two different phase states is caused toward the amorphous state by means of a short electric current pulse having a relatively high current intensity, which pulse generates heat, whereby the material of the resistor is heated. After the end of the current pulse, the material cools down very rapidly, so that it undergoes transition to the amorphous state and does not crystallize. The change in the resistance material back to the crystalline phase is effected by a longer current pulse having a lower current intensity. As a result, the amorphous material is heated beyond the glass transition temperature and kept at this temperature until nucleation or seed growth commences and crystallization takes place. The duration and the intensity of the electric current pulse thus can determine whether the material of the resistance element undergoes transition to the amorphous phase and hence has a high resistance value or whether the material of the resistance element undergoes transition to the crystalline phase and hence has a low resistance value. Typical values for phase change elements are a reset current of 200 µA over 20 ns with a subsequent resistance value in the region of 1 MΩ and a set current of approximately 50 µA over 50 ns, which results in a resistance value of 10 kΩ.

A positive aspect of PCRAM technology is that scaling is not disadvantageous, but rather is even advantageous: the smaller the structures become, the smaller can be the electric currents required to induce the phase change between amorphous phase and polycrystalline phase. Furthermore, it is possible to realize phase change elements by sublithographic techniques in the upper layers of a CMOS process and the resistors can therefore be stacked over the transistors, for example over those required for forming the memory cell. The chalcogenide compounds that are suitable for the PCRAM techniques are GeSbTe or AgInSbTe, by way of example. However, the invention is not restricted to PCRAM-based resistance elements, rather it can also be implemented with any other technology suitable therefor, such as MRAM technology or CBRAM technology, by way of example.

MRAM technology is based on the principle of the magnetically induced change in resistance. One of the effects on which this principle is based is the tunneling magnetoresistance effect. In this case, the resistances comprise e.g. two ferromagnetic layers separated by an oxide layer having a thickness of e.g. 1 nm. If the orientation of the magnetization of the two ferromagnetic layers is identical, electrons can easily tunnel through the oxide layer, so that the resistance is low, but if the magnetization of the two ferromagnetic layers has opposite orientations, then the resistance is high because the probability of the electrons tunneling trough the oxide layer is low in this case.

A further effect that is employed in MRAM technology and is related to the tunneling resistance effect is the giant magnetoresistance effect. In this case, two ferromagnetic layers are separated by a few atomic layers of nonmagnetic material, such as copper, by way of example. The magnetizations of the ferromagnetic layers then have opposite orientations. This quasi antiferromagnetic ordering is so unstable, however, that even a small external magnetic field brings the layer system to the ferromagnetic state in which the layers have an identical magnetic orientation. The electrical resistance of the layer structure changes greatly in this case, which has led to the term giant magnetoresistance.

The principle of CBRAM technology is based on the voltage-induced diffusion of metal ions in a solid electrolyte. As a result of the application of a voltage of suitable polarization, metal ions can thus firstly be generated and then migrate in the electric field between two electrodes and consequently form a conductive bridge. If a suitable voltage of inverse polarity is then applied, metal ions are removed from the solid electrolyte, the conductive bridge collapses and the resistance rises. The difference in resistance between established conductive bridge and absent bridge is approximately 6 orders of magnitude. Both states have a storage retention of approximately 10 years. The switching times of CBRAM technology are approximately 10 ns.

Figure 5B:
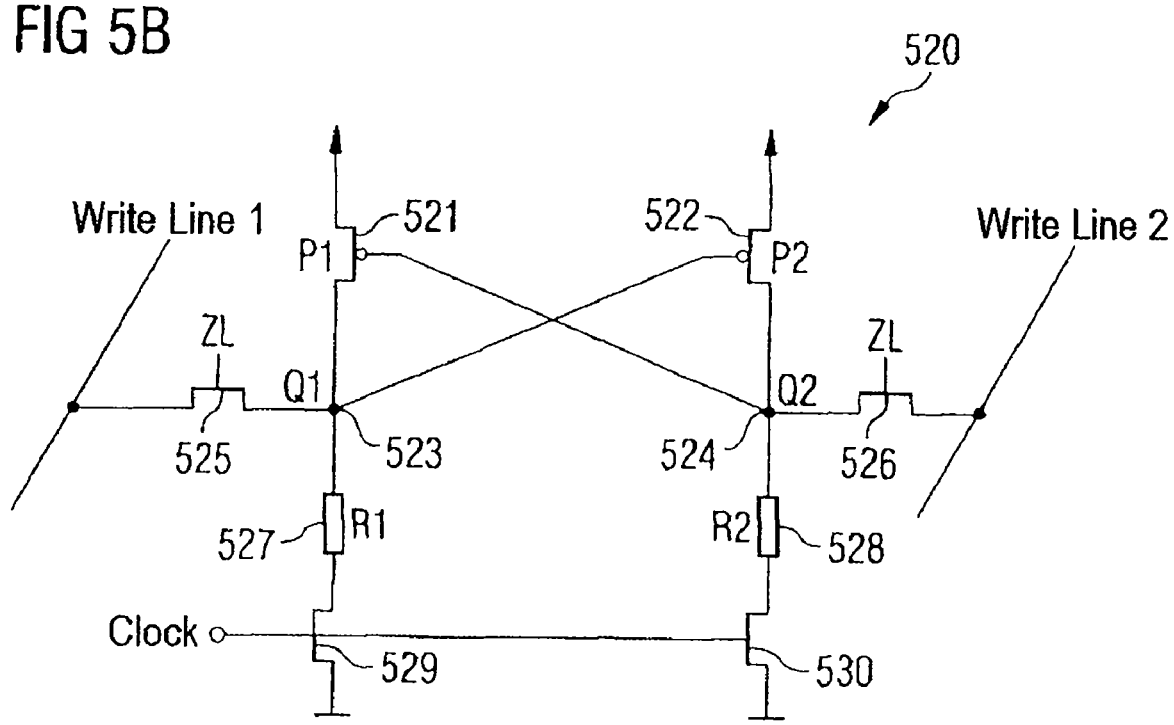

FIG. 5b shows a further exemplary embodiment in accordance with the present invention, the first transistor 521 and the second transistor 522 being p-field effect transistors and the other transistors being n-field effect transistors. Apart from the fact that it is a CMOS circuit arrangement, the arrangement of the switching elements is analogous to FIG. 5a, with the difference that the second terminal of the first transistor 521, or the second terminal of the second transistor 522, is not coupled to the ground potential, but rather is coupled to the operating voltage, and the second terminal of the fifth transistor 529, or the second terminal of the sixth transistor 530, is not coupled to the operating voltage, but rather is coupled to the ground potential.

The functioning of the circuit will be described with reference to FIG. 5b.

The resistance elements $R_1$ and $R_2$ are always programmed in such a way that either $R_1=0\,\Omega$ (on) and $R_2=\infty\,\Omega$ (off) or $R_1=\infty\,\Omega$ (off) and $R_2=0\,\Omega$ (on).

The writing operation of the cell has a programming phase and a toggle phase. In the programming phase, a set current or a reset current or a charge is sent through the resistors $R_1$ 527 and $R_2$ 528 by means of the write lines of the n-FET pass transistors 525, 526, while the access line ZL is active. $R_1$ 527 and $R_2$ 528 are programmed complementarily; by way of example, $R_1$ 527 is programmed to off and $R_2$ 528 is programmed to on.

The toggle phase is effected for example if the currents or charges of the two write lines have the same polarity, so that the nodes $Q_1$ 523 and $Q_2$ 524 have the same logic value if the pass transistors 525, 526 are turned off. In the case where the nodes $Q_1$ and $Q_2$ have the logic value "1", the two transistors $P_1$ 521 and $P_2$ 522 are turned off. The nodes $Q_1$ and $Q_2$ then begin to be discharged via the resistors $R_1$ and $R_2$. If, by way of example, $R_1$ is in the off state and $R_2$ is in the on state, then $Q_1$ remains at "1" while $Q_2$ becomes "0". Consequently, the device toggles into a stable, continuous state, $Q_1$ and $Q_2$ having complementary values. Since the output value is stable, it can be read out at any time.

The programmed logic values are reestablished in the memory cell in the case where the nodes $Q_1$ and $Q_2$ were discharged after the turn-off time duration. During switch-on, the operating voltage $V_{dd}$ is ramped up again and causes the potential at $Q_1$ and $Q_2$ to increase. $R_1$ and $R_2$ determine which potential increases more rapidly and ensure that the cell toggles to the desired state. If, by way of example, $R_1$ is off and $R_2$ is on, the potential at $Q_1$ rises more rapidly and the cell toggles, so that $Q_1$="1" and $Q_2$="0".

Expressed in general terms, the programming of the first resistor 507 that can be programmed in nonvolatile fashion and of the second resistor 508 that can be programmed in nonvolatile fashion takes place in such a way that the two resistors that can be programmed in nonvolatile fashion have permanent resistance values that are complementary to one another, so that either the first resistor 507 that can be programmed in nonvolatile fashion has a low resistance value and the second resistor 508 that can be programmed in nonvolatile fashion has a high resistance value, or the first resistor 507 that can be programmed in nonvolatile fashion has a high resistance value and the second resistor 508 that can be programmed in nonvolatile fashion has a low resistance value.

The toggle phase involves the setting of a defined permanent state of the first node 503 and of the second node 504 of the nonvolatile memory cell 500, the logic values of the first node 503 and of the second node 504 corresponding to the respective resistance values of the two resistors that can be programmed in nonvolatile fashion and were programmed previously, which, expressed generally, in detail proceeds as follows, it being assumed on account of the symmetry of the circuit, without any restriction of generality, that the first resistor 507 has been programmed to a low resistance value and the second resistor 508 has been programmed to a high resistance value:

The potential of the first node 503 coupled to the first terminal of the first resistor 507 changes in the direction of the potential which is present at the second terminal of the first resistor 507 and which may be an operating potential or a reference potential.

The potential at the gate terminal of the second transistor 502, which is coupled to the first node 503 via the gate terminal, changes on account of the coupling to the first node 503 and thus activates the second transistor 502, so that the potential of the second node 504 is changed in the direction of the potential which is present at the second source/drain terminal of the second transistor 502 and which is complementary to the potential present at the second terminal of the first resistor 507.

The potential at the gate terminal of the first transistor 501 changes on account of the coupling to the second node 504 and thus turns the first transistor 501 off, so that the potential of the first node 503 is changed in the direction of the potential present at the second terminal of the first resistor 507, the potential present at the second terminal of the first resistor 507 being complementary to the potential present at the second source/drain terminal of the second transistor 502.

Finally, the behavior of the memory cell when the operating voltage source of the nonvolatile memory cell is switched on again will also be explained generally: when the operating voltage source is switched on again, the potentials corresponding to logic values present in the first node and the second node are provided, which correspond to the permanently programmed, mutually complementary resistance values of the first resistor that can be electrically programmed in nonvolatile fashion and of the second resistor that can be electrically programmed in nonvolatile fashion, the operation having the following steps:

Ramping up the operating voltage, the potential rising at the two nodes.

The resistors that can be electrically programmed in nonvolatile fashion and have different conductivities bring about a different increase in the potential at the first node and the second node.

Different potentials are then present at the gate terminals of the first transistor and of the second transistor, said gate terminals being coupled to the first node and the second node, so that a different potential is dropped across the first transistor in the source/drain direction than across the second transistor, which leads to an amplification of the potential difference between the potential at the first node and at the second node, so that the state of the two nodes with mutually complementary logic values that was present prior to the turn-off is reestablished.

Figure 5C:
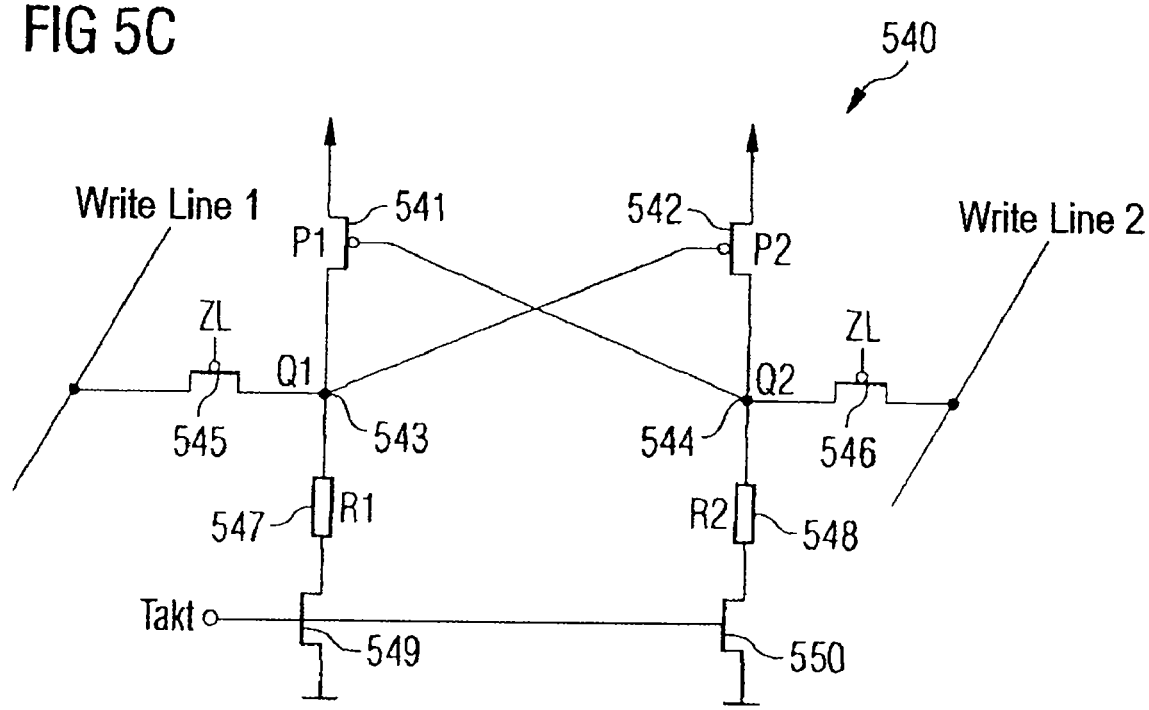

FIG. 5c shows yet another exemplary embodiment in accordance with the present invention, the first transistor 541, the second transistor 542, the third transistor 545 and the fourth transistor 546 being p-field effect transistors, and the fifth transistor 549 and the sixth transistor 550 being n-field effect transistors. The arrangement is analogous to the arrangement in FIG. 5b. It is advantageous if the full operating voltage $V_{dd}$ is necessary at the nodes 543, 544 in order to program the resistance elements.

Figure 5D:
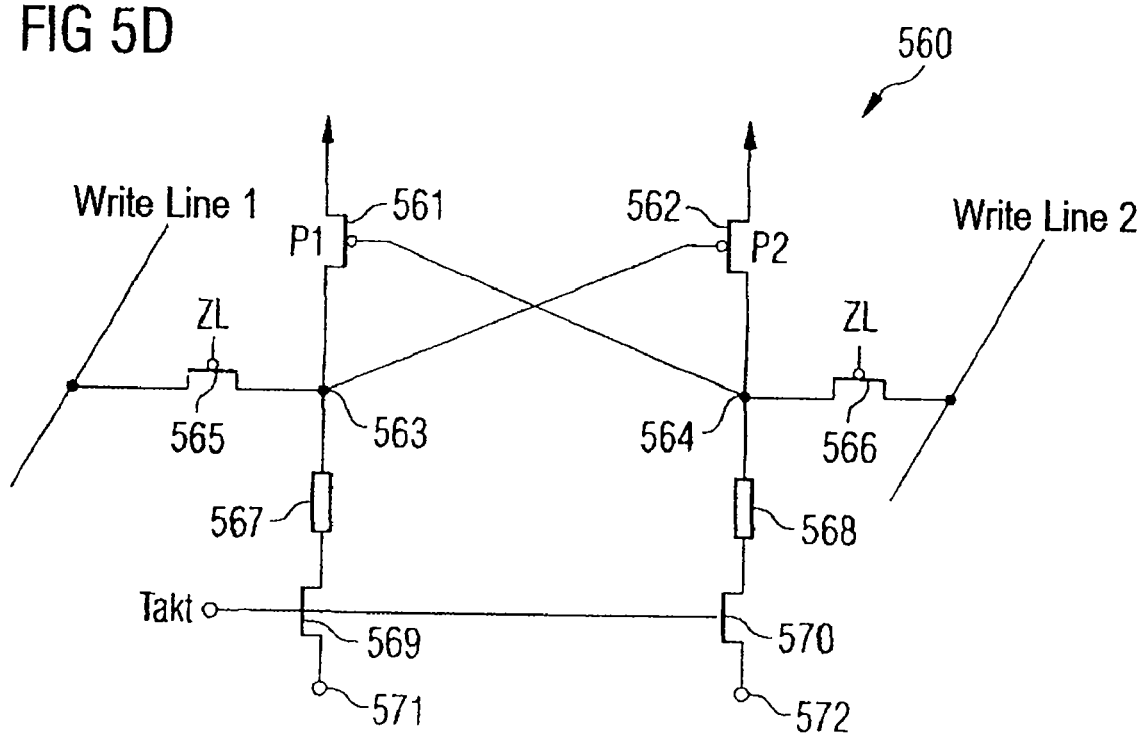

FIG. 5d shows a further exemplary embodiment in accordance with the invention, in which the reference potential at the nodes 571, 572, to which the second source/drain terminal of the fifth transistor 569 and the second source/drain terminal of the sixth transistor 570 are connected, is not the ground potential. The arrangement is analogous to the arrangement in FIG. 5c.

Figure 5E:
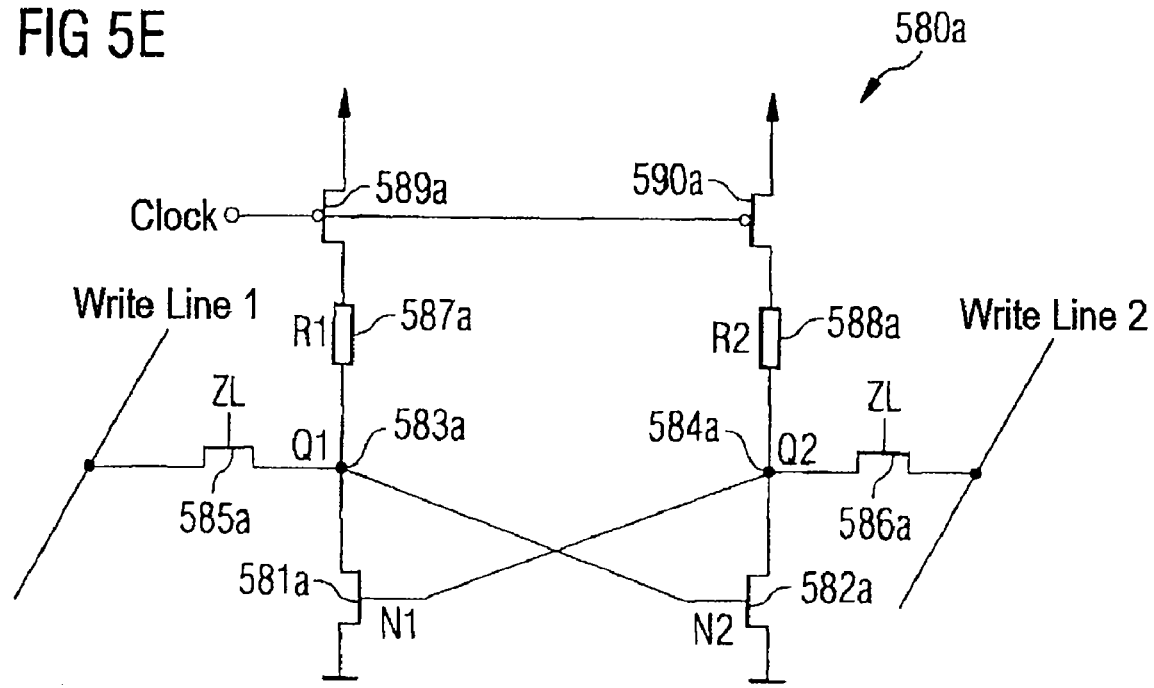

FIG. 5e shows an exemplary embodiment in accordance with the present invention, the first transistor 581a, the second transistor 582a, the third transistor 585a and the fourth transistor 586a being n-field effect transistors, and the fifth transistor 589a and the sixth transistor 590a being p-field effect transistors. The fifth transistor 589a and the sixth transistor 590a are in each case connected between the resistors for reducing the leakage currents 587a, 588a and the operating voltage.

Figure 5F:
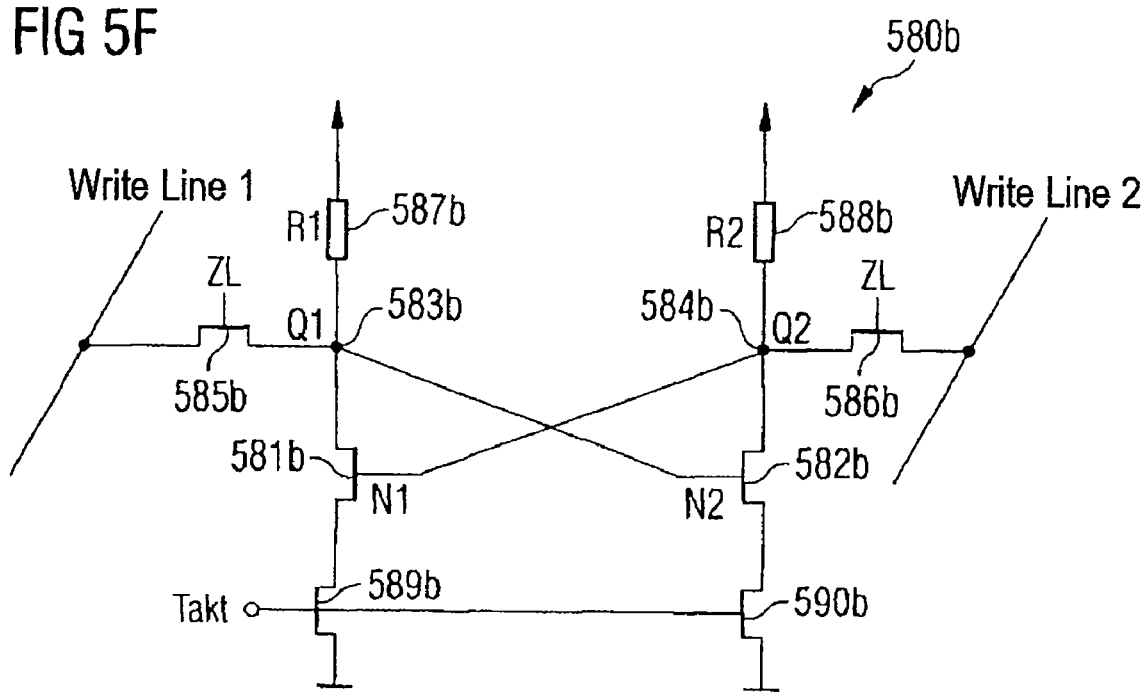

FIG. 5f shows an exemplary embodiment in accordance with the present invention, in which the same transistors as in FIG. 5a are used. In contrast to FIG. 5a, however, the transistors for reducing the leakage currents 589b, 590b are connected between the first transistor 581b and, respectively, the second transistor 582b and the reference potential.

All the exemplary embodiments in FIGS. 5a-5f have two clocked transistors which can in each case isolate a resistance element for avoiding leakage current from the reference potential. Since a transistor in the turned-off state typically represents a significantly higher resistance than a nonvolatile memory element programmed to high resistance, it is thus ensured that a voltage level is stored for as lengthy a period of time as possible in the case of a clock turn-off. Therefore, the clock only has to be pulsed at relatively long time intervals, which reduces the power loss.

Figure 6A:
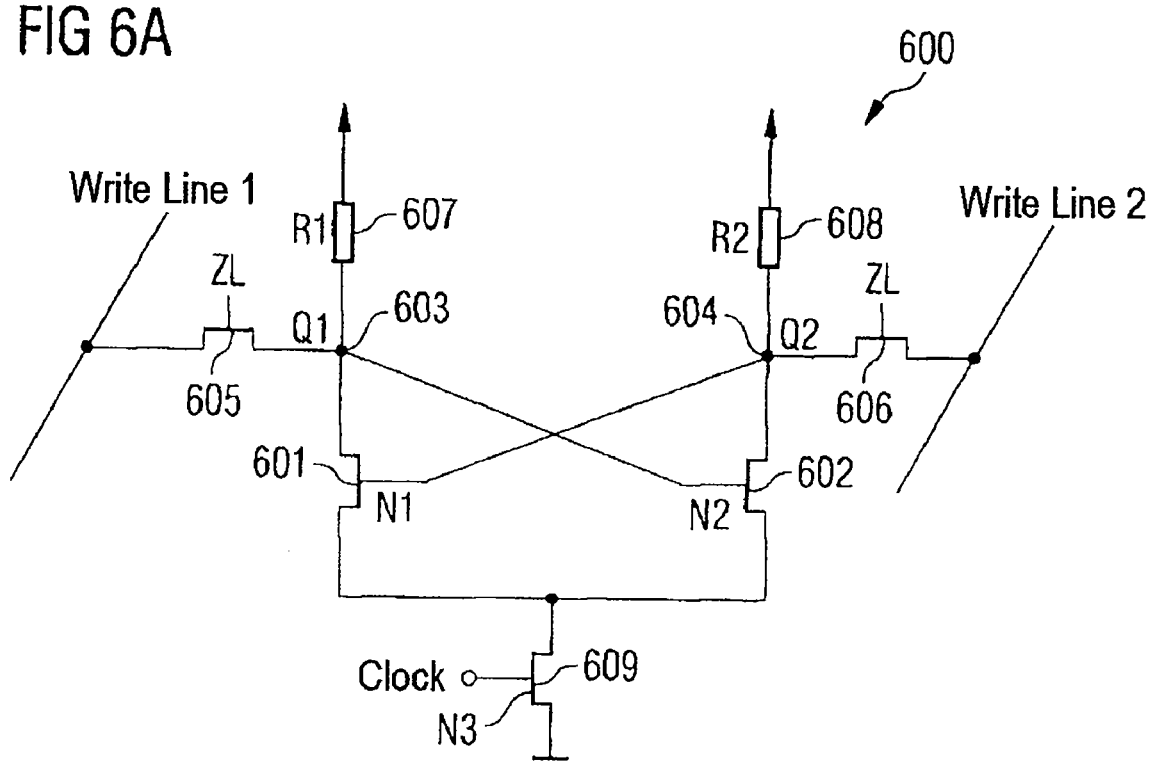
FIGS. 6*a* and 6*b* show nonvolatile memory cells with precisely one transistor for reducing leakage currents in accordance with the invention.

FIG. 6a shows a nonvolatile memory cell 600. It is analogous to the arrangement in FIG. 5a with the difference that it has precisely one transistor 609 for reducing the leakage currents. The said transistor is connected between the first transistor 601 and the second transistor 602 and the reference potential, so that the full voltage swing is ensured for read/write operations and a high integration density and a low fabrication outlay are nevertheless achieved by virtue of using only n-field effect transistors.

Figure 6B:
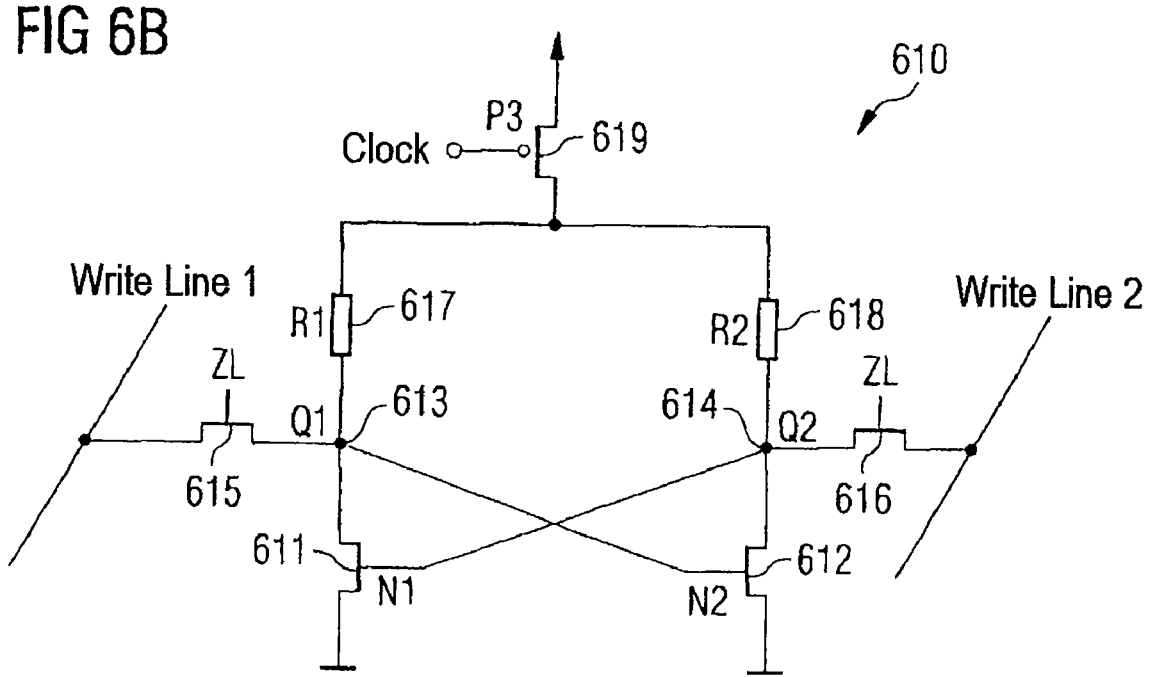

FIG. 6b shows a nonvolatile memory cell 610 constructed in a manner similar to that in FIG. 6a, the transistor for reducing the leakage currents 619 being a p-field effect transistor and the transistor for reducing the leakage currents 619 being connected between the first resistor 617, the second resistor 618 and the operating voltage.

FIG. 7 shows a further embodiment of the invention, in which a respective gate terminal of a transmission gate switch 703 is connected to the outputs 701, 702 of the memory cell. In this case, the transmission gate switch 703 is controlled by the memory cell and the data are provided in a nonvolatile and distributed manner. The complementary signal is sent from the two outputs 701, 702 of the memory cell in each case directly to the two gate terminals of the transmission gate switch 703 without additional devices such as sense amplifiers.

FIG. 8 shows yet another embodiment of the invention, the memory cell being connected to the output buffer.

In general, the advantage of the invention is that by interposing transistors in each case between the two resistors that can be programmed in a nonvolatile fashion and the reference potential or the operating voltage source, the leakage currents through the two resistors that can be programmed in nonvolatile fashion are reduced, as a result of which the energy consumption of the memory cell is reduced. Since applications are often mobile nowadays, the energy consumption of memory arrangement plays a crucial part.

The invention claimed is:

1. A nonvolatile memory cell, comprising:
   a first resistor that is electrically programmed in a nonvolatile fashion;
   a second resistor that is electrically programmed in a nonvolatile fashion;
   a first leakage current reducing element connected between the first resistor and an operating potential; and
   a second leakage current reducing element connected between the second resistor and the operating potential.

2. The nonvolatile memory cell as claimed in claim 1, wherein the first leakage current reducing element has at least one transistor.

3. The nonvolatile memory cell as claimed in claim 1, wherein the second leakage current reducing element has at least one transistor.

4. The nonvolatile memory cell as claimed in claim 1, further comprising a leakage current reducing element drive, which drives the first leakage current reducing element and the second leakage current reducing element such that the programming of the first and second resistors and a read-out from the memory cell are possible and the leakage currents are reduced by the first leakage current reducing element and the second leakage current reducing element.

5. A semiconductor component, having at least one nonvolatile memory cell as claimed in claim 1.

6. A nonvolatile memory cell comprising:
a first transistor and a second transistor;
a first source/drain terminal of the first transistor being coupled to a first node;
a first source/drain terminal of the second transistor being coupled to a second node;
the first transistor and the second transistor being cross-coupled to one another, the gate terminal of the first transistor being coupled to the second node and the gate terminal of the second transistor being coupled to the first node;
a third transistor, the first source/drain terminal of which is coupled to the first node the second source/drain terminal of which is coupled to a first write line, and the gate terminal of which is coupled to an access line;
a fourth transistor, the first source/drain terminal of which is coupled to the second node, the second source/drain terminal of which is coupled to a second write line and the gate terminal of which is coupled to the access line;
a first resistor that is electrically programmable in a nonvolatile fashion, the first terminal of the first resistor being coupled to the first node;
a second resistor that is electrically programmable in a nonvolatile fashion, the first terminal of the second resistor being coupled to the second node;
a fifth transistor for reducing the leakage current flowing through the first resistor, the first source/drain terminal of the transistor being coupled to the second terminal of the first resistor or to the second terminal of the first transistor; and
a sixth transistor for reducing the leakage current flowing through the second resistor, the first source/drain terminal of the sixth transistor being coupled to the second terminal of the second resistor or to the second terminal of the second transistor.

7. The nonvolatile memory cell as claimed in claim 6, wherein the transistors are field effect transistors.

8. The nonvolatile memory cell as claimed in claim 7, wherein the transistors are n-field effect transistors.

9. The nonvolatile memory cell as claimed in claim 8, wherein the second source/drain terminal of the fifth transistor and the second source/drain terminal of the sixth transistor in each case is coupled to the operating voltage.

10. The nonvolatile memory cell as claimed in claim 9, wherein the second source/drain terminal of the first transistor and of the second transistor in each case is coupled to a reference potential.

11. The nonvolatile memory cell as claimed in claim 10, wherein the reference potential is ground potential.

12. The nonvolatile memory cell as claimed in claim 8, wherein the second source/drain terminal of the fifth transistor and of the sixth transistor in each case are coupled to a reference potential.

13. The nonvolatile memory cell as claimed in claim 12, wherein the reference potential is ground potential.

14. The nonvolatile memory cell as claimed in claim 6, wherein the first transistor, the second transistor, the third transistor, and the fourth transistor are n-field effect transistors, and the fifth transistor and the sixth transistor are p-field effect transistors.

15. The nonvolatile memory cell as claimed in claim 6, wherein the first transistor and the second transistor are p-field effect transistors, and the third transistor, the fourth transistor, the fifth transistor, and the sixth transistor are n-field effect transistors.

16. The nonvolatile memory cell as claimed in claim 15, wherein the second source/drain terminal of the first transistor and of the second transistor in each case is coupled to the operating voltage.

17. The nonvolatile memory cell as claimed in claim 6, wherein the first transistor, the second transistor, the third transistor, and the fourth transistor are p-field effect transistors, and the fifth transistor and the sixth transistor are n-field effect transistors.

18. The nonvolatile memory cell as claimed in claim 6, wherein the first and second resistors are configured at least as one of a phase change random access memory, a magnetoresistive random access memory, and a conductive-bridging random access memory.

19. The nonvolatile memory cell as claimed in claim 6, wherein the first node is coupled to the gate terminal of a first transistor of a transmission gate switch and the second node is coupled to the gate terminal of a second transistor of the transmission gate switch.

20. The nonvolatile memory cell as claimed in claim 6, further comprising at least one output buffer which is coupled to an output of the memory cell.

21. A semiconductor component, having at least one nonvolatile memory cell as claimed in claim 6.

22. A nonvolatile memory cell comprising:
a first transistor and a second transistor;
a first source/drain terminal of the first transistor being coupled to a first node;
a first source/drain terminal of the second transistor being coupled to a second node;
the first transistor and the second transistor being cross-coupled to one another, the gate terminal of the first transistor being coupled to the second node and the gate terminal of the second transistor being coupled to the first node;
a third transistor, the first source/drain terminal of which is coupled to the first node the second source/drain terminal of which is coupled to a first write line, and the gate terminal of which is coupled to an access line;
a fourth transistor, the first source/drain terminal of which is coupled to the second node, the second source/drain terminal of which is coupled to a second write line and the gate terminal of which is coupled to the access line;
a first resistor that is electrically programmable in a nonvolatile fashion, the first terminal of the first resistor being coupled to the first node;
a second resistor that is electrically programmable in a nonvolatile fashion, the first terminal of the second resistor being coupled to the second node; and
a fifth transistor for reducing the leakage current, the first source/drain terminal of the fifth transistor being coupled to the second source/drain terminal of the first transistor and the second source/drain terminal of the second transistor.

23. The nonvolatile memory cell as claimed in claim 22, wherein the transistors are field effect transistors.

24. The nonvolatile memory cell as claimed in claim 23, wherein the transistors are n-field effect transistors.

25. The nonvolatile memory cell as claimed in claim 24, wherein the second source/drain terminal of the fifth transistor and the second source/drain terminal of the sixth transistor in each case is coupled to the operating voltage.

26. The nonvolatile memory cell as claimed in claim 25, wherein the second source/drain terminal of the first transistor and of the second transistor in each case is coupled to a reference potential.

27. The nonvolatile memory cell as claimed in claim 26, wherein the reference potential is ground potential.

28. The nonvolatile memory cell as claimed in claim 24, wherein the second source/drain terminal of the fifth transistor and of the sixth transistor in each case are coupled to a reference potential.

29. The nonvolatile memory cell as claimed in claim 28, wherein the reference potential is ground potential.

30. The nonvolatile memory cell as claimed in claim 22, wherein the first transistor, the second transistor, the third transistor, and the fourth transistor are n-field effect transistors, and the fifth transistor and the sixth transistor are p-field effect transistors.

31. The nonvolatile memory cell as claimed in claim 22, wherein all of the transistors are n-field effect transistors, and the fifth transistor for reducing the leakage current is connected between the reference potential and the first transistor and the second transistor.

32. The nonvolatile memory cell as claimed in claim 22, wherein the first transistor, the second transistor, the third transistor, and the fourth transistor are n-field effect transistors, and the fifth transistor for reducing the leakage current is a p-field effect transistor connected between the operating voltage and the first transistor and the second transistor.

33. The nonvolatile memory cell as claimed in claim 22, wherein the first and second resistors are configured at least as one of a phase change random access memory, a magnetoresistive random access memory, and a conductive-bridging random access memory.

34. The nonvolatile memory cell as claimed in claim 22, wherein the first node is coupled to the gate terminal of a first transistor of a transmission gate switch and the second node is coupled to the gate terminal of a second transistor of the transmission gate switch.

35. The nonvolatile memory cell as claimed in claim 22, further comprising at least one output buffer which is coupled to an output of the memory cell.

36. A semiconductor component, having at least one nonvolatile memory cell as claimed in claim 22.

* * * * *

UNITED STATES PATENT AND TRADEMARK OFFICE
CERTIFICATE OF CORRECTION

PATENT NO. : 7,436,694 B2
APPLICATION NO. : 11/444295
DATED : October 14, 2008
INVENTOR(S) : Joerg Berthold et al.

It is certified that error appears in the above-identified patent and that said Letters Patent is hereby corrected as shown below:

Col. 1, ln. 7, delete "102050024897.7" and insert --102005024897.7--;

Col. 4, ln. 5, delete "firth" and insert --fifth--; and

Col. 8, ln. 50, delete "value:" and insert --value.--.

Signed and Sealed this

Third Day of February, 2009

JOHN DOLL
*Acting Director of the United States Patent and Trademark Office*